(12) United States Patent
Sekiya

(10) Patent No.: US 10,109,528 B2
(45) Date of Patent: Oct. 23, 2018

(54) WAFER PROCESSING METHOD

(71) Applicant: DISCO CORPORATION, Tokyo (JP)

(72) Inventor: Kazuma Sekiya, Tokyo (JP)

(73) Assignee: DISCO Corporation, Tokyo (JP)

(*) Notice: Subject to any disclaimer, the term of this patent is extended or adjusted under 35 U.S.C. 154(b) by 14 days.

(21) Appl. No.: 15/586,889

(22) Filed: May 4, 2017

(65) Prior Publication Data
US 2017/0330799 A1    Nov. 16, 2017

(30) Foreign Application Priority Data

May 11, 2016    (JP) .................................. 2016-095248

(51) Int. Cl.
| | | |
|---|---|---|
| *H01L 21/78* | (2006.01) | |
| *H01L 21/02* | (2006.01) | |
| *H01L 21/268* | (2006.01) | |
| *H01L 21/683* | (2006.01) | |

(52) U.S. Cl.
CPC ........ *H01L 21/78* (2013.01); *H01L 21/02013* (2013.01); *H01L 21/02016* (2013.01); *H01L 21/268* (2013.01); *H01L 21/6836* (2013.01); *H01L 2221/68336* (2013.01)

(58) Field of Classification Search
None
See application file for complete search history.

(56) References Cited

U.S. PATENT DOCUMENTS

| | | | | |
|---|---|---|---|---|
| 6,352,073 | B1* | 3/2002 | Kurosawa | ............ B28D 5/0094 |
| | | | | 125/35 |
| 2005/0282359 | A1* | 12/2005 | Nagai | .................. B28D 5/0011 |
| | | | | 438/459 |

FOREIGN PATENT DOCUMENTS

| | | |
|---|---|---|
| JP | 2005-223284 | 8/2005 |
| JP | 2006-012902 | 1/2006 |

* cited by examiner

*Primary Examiner* — Eva Y Montalvo
*Assistant Examiner* — Kevin Quinto
(74) *Attorney, Agent, or Firm* — Greer Burns & Crain Ltd.

(57) ABSTRACT

A wafer processing method includes a modified layer forming step of applying a laser beam so as to focus the laser beam inside the wafer, and form a modified layer along each division line, a wafer supporting step of attaching an expandable dicing tape to the back side of the wafer and mounting the peripheral portion of the dicing tape to an annular frame before or after performing the modified layer forming step, a tape expanding step of expanding the dicing tape attached to the back side of the wafer, and an air blowing step of blowing air against the wafer in the condition where the dicing tape is expanded, thereby dividing the wafer into individual device chips along each division line where the modified layer is formed and also increasing the spacing between any adjacent ones of the device chips.

4 Claims, 11 Drawing Sheets

WAFER PROCESSING METHOD

BACKGROUND OF THE INVENTION

Field of the Invention

The present invention relates to a wafer processing method for dividing a wafer into a plurality of device chips.

Description of the Related Art

In dividing a wafer formed of silicon, SiC, sapphire, etc. into a plurality of device chips, a laser beam having a transmission wavelength to the wafer is focused inside the wafer to generate multiphoton absorption, thereby locally modifying the inside of the wafer to form a modified layer (modified region) inside the wafer (see Japanese Patent Laid-Open Nos. 2005-223284 and 2006-12902, for example). The modified layer is brittle as compared with the other region of the wafer, so that the wafer can be broken along the modified layer by simply applying a small external force to the wafer, thus obtaining the plural device chips. For example, an external force may be applied to the wafer by a method of expanding an expandable dicing tape (expansion tape) attached to the wafer or by a method of pressing a blade against each division line (street) formed on the wafer.

SUMMARY OF THE INVENTION

However, in the method of expanding the expandable dicing tape, there is a possibility that the amount of expansion of the dicing tape may lack and the wafer cannot therefore be properly broken. Further, this method is not suitable for obtaining a large force. Accordingly, there is a case that the wafer cannot be broken at all depending upon its kind. On the other hand, in the method of pressing the blade against each division line, a sufficient force for breaking the wafer can be obtained. However, in this method, the blade must be pressed against all of the division lines on the wafer, causing a reduction in productivity.

It is therefore an object of the present invention to provide a wafer processing method which can properly divide a wafer and can also improve the productivity of device chips.

In accordance with an aspect of the present invention, there is provided a wafer processing method for dividing a wafer into a plurality of individual device chips along a plurality of crossing division lines, the division lines being formed on a front side of the wafer to thereby define a plurality of separate regions where a plurality of devices are individually formed, the device chips individually corresponding to the devices. The wafer processing method includes a modified layer forming step, a wafer supporting step, a tape expanding step, and an air blowing step. The modified layer forming step applies a laser beam having a transmission wavelength to the wafer along each division line so as to focus the laser beam inside the wafer, thereby forming a modified layer inside the wafer along each division line. The wafer supporting step attaches an expandable dicing tape to a back side of the wafer and mounts a peripheral portion of the dicing tape to an annular frame before or after performing the modified layer forming step. The tape expanding step expands the dicing tape attached to the back side of the wafer. The air blowing step blows air against the wafer in the condition where the dicing tape is expanded, thereby dividing the wafer into the individual device chips along each division line where the modified layer is formed and also increasing spacing between any adjacent ones of the device chips.

Preferably, the air blowing step is performed by using an air knife for blowing the air. Preferably, the wafer processing method further includes a back grinding step of grinding the back side of the wafer in the condition where a protective member is attached to the front side of the wafer, before performing the modified layer forming step, thereby reducing a thickness of the wafer to a predetermined thickness. Preferably, the air blowing step is started simultaneously with the tape expanding step.

In the wafer processing method according to the present invention, the air is blown against the wafer in the condition where the dicing tape attached to the back side of the wafer is expanded. Accordingly, a force produced by the expansion of the dicing tape and a force produced by the blowing of the air can be used in combination to thereby properly divide the wafer. Further, in the wafer processing method according to the present invention, the air is simply blown against the wafer in the condition where the dicing tape is expanded. That is, it is unnecessary to press a blade or the like against all of the division lines. Accordingly, the productivity of the device chips can also be improved. Thus, it is possible to provide a wafer processing method which can properly divide the wafer and can also improve the productivity of the device chips.

Further, in the wafer processing method according to the present invention, it is unnecessary to press a blade or the like against each division line. Accordingly, it is possible to suppress the possibility that the device chips may be damaged in dividing the wafer. Further, in the wafer processing method according to the present invention, the air is blown against the wafer in the condition where the dicing tape is expanded. Accordingly, when the wafer is divided into the device chips, the spacing between any adjacent ones of the device chips can be increased. As a result, it is possible to suppress the possibility that the adjacent device chips may come into contact with each other in a subsequent step to cause damage to each device chip.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of a wafer processing method according to the present invention will now be described with reference to the attached drawings. The wafer processing method according to the preferred embodiment includes a back grinding step (see FIGS. 2 and 3), a modified layer forming step (see FIGS. 4 and 5), a wafer supporting step (see FIGS. 6A and 6B), a tape expanding step (see FIGS. 7A and 7B), and an air blowing step (see FIGS. 8A and 8B). In the back grinding step, the back side of a wafer is ground to thereby reduce the thickness of the wafer to a predetermined thickness. In the modified layer forming step, a laser beam having a transmission wavelength to the wafer is applied to the wafer along each division line in the condition where the laser beam is focused inside the wafer, thereby forming a modified layer inside the wafer along each division line. In the wafer supporting step, an expandable dicing tape is attached to the back side of the wafer and the peripheral portion of the dicing tape is fixed to an annular frame. In the tape expanding step, the dicing tape attached to the back side of the wafer is expanded. In the air blowing step, air is blown against the wafer in the condition where the dicing tape is expanded, whereby the wafer can be divided into individual device chips along each division line where the modified layer is formed, and the spacing between any adjacent ones of the device chips can also be increased. The wafer processing method according to the preferred embodiment will now be described in more detail.

Figure 1:
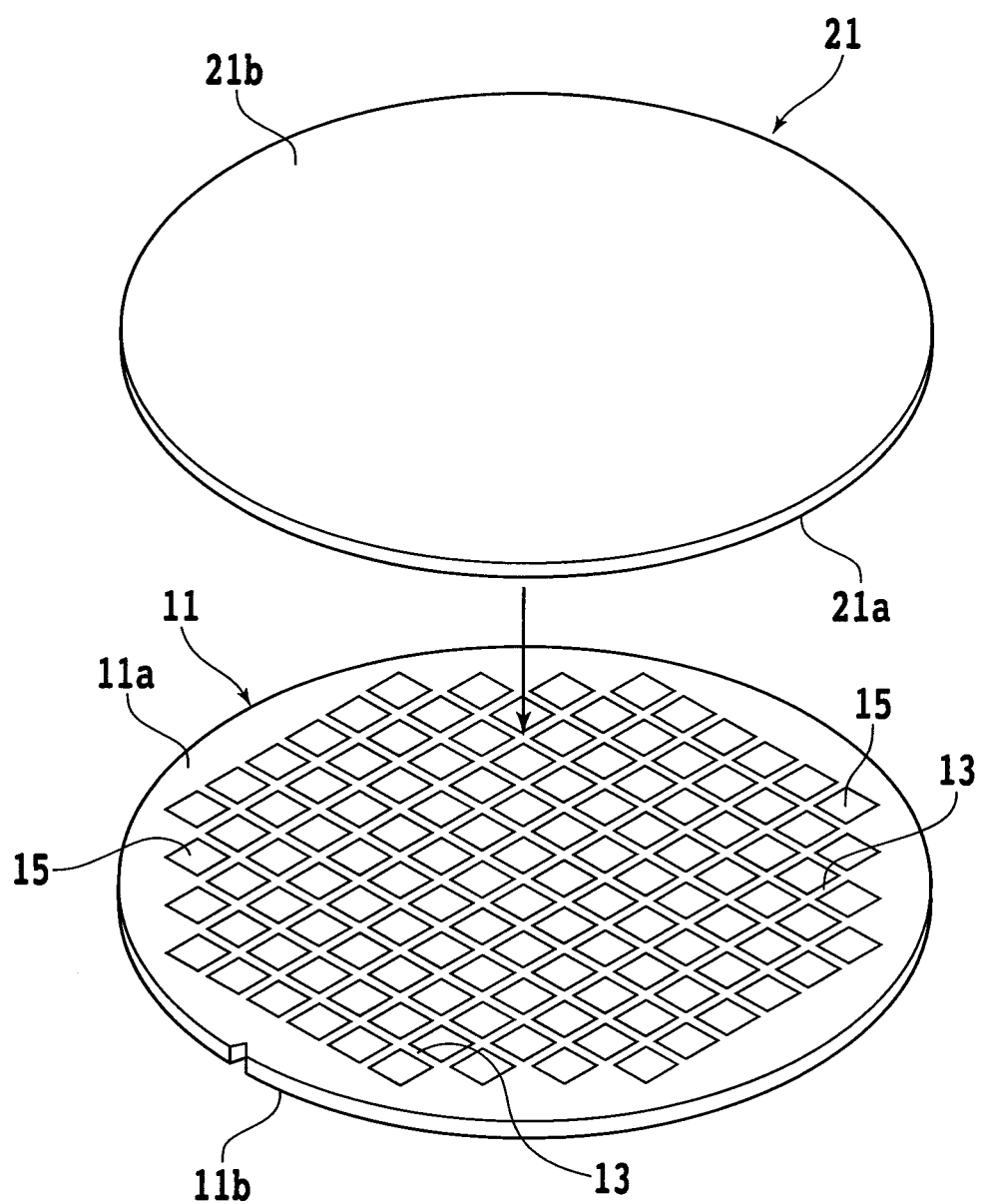
FIG. 1 is a schematic perspective view of a wafer and a protective member to be attached to the wafer.

FIG. 1 is a schematic perspective view showing a wafer to be processed in the preferred embodiment. As shown in FIG. 1, a wafer 11 as a workpiece is a disk-shaped member formed of sapphire or SiC, for example. The wafer 11 has a front side 11a and a back side 11b. The front side 11a of the wafer 11 is composed of a central device area and a peripheral marginal area surrounding the device area. The device area is partitioned by a plurality of crossing division lines (streets) 13 to thereby define a plurality of separate regions where a plurality of devices 15 such as light-emitting diodes (LEDs) are individually formed. The material, shape, structure, etc. of the wafer 11 are not limited to those mentioned above in the present invention. For example, the wafer 11 may be formed of any arbitrary semiconductor, ceramic, resin, metal, etc. Further, the arrangement of the division lines 13 and the kind of the devices 15, for example, are not limited.

As shown in FIG. 1, a protective member 21 is previously attached to the front side 11a of the wafer 11. The protective member 21 may be provided by a circular member having substantially the same size as that of the wafer 11, such as a tape (film), resin substrate, and wafer of the same as or different from the wafer 11 in kind. The protective member 21 has a first side 21a and a second side 21b opposite to the first side 21a. An adhesive layer (paste layer) having adherence to the wafer 11 is formed on the first side 21a of the protective member 21. This adhesive layer is formed of resin, for example. By bringing the first side 21a of the protective member 21 into contact with the front side 11a of the wafer 11, the protective member 21 can be attached to the wafer 11. Since the protective member 21 is attached to the front side 11a of the wafer 11 where the devices 15 are formed, it is possible to prevent possible damage to the devices 15 due to a load applied to the wafer 11 in the following back grinding step.

Figure 2:
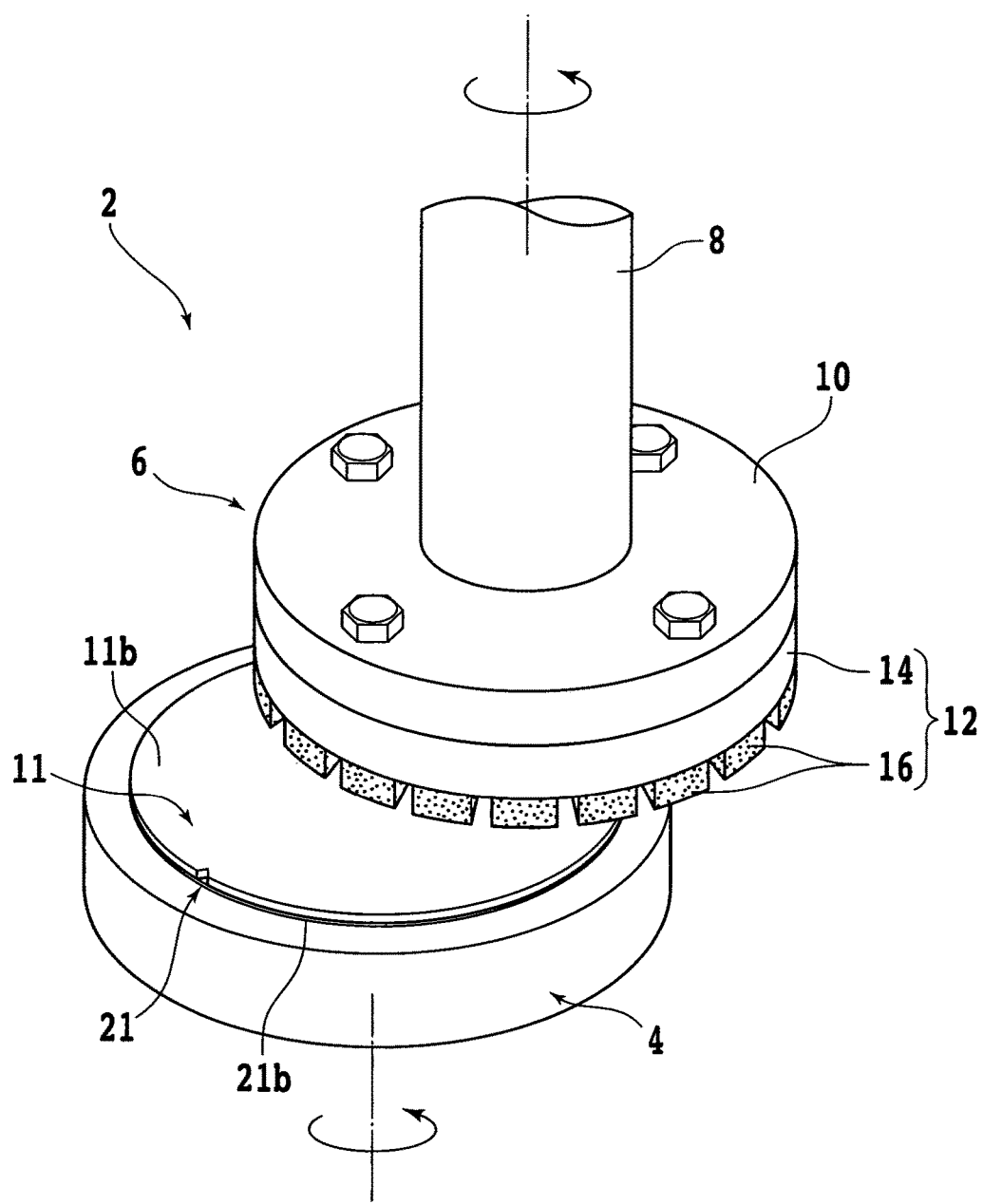
FIG. 2 is a schematic perspective view showing a back grinding step according to a preferred embodiment of the present invention.
Figure 3:
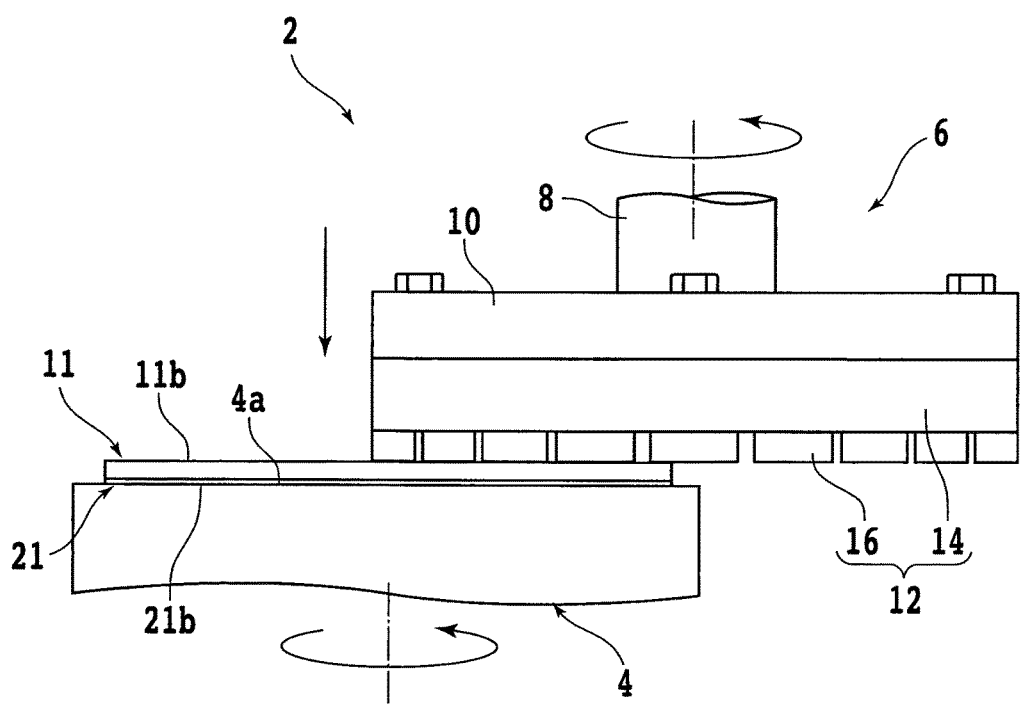
FIG. 3 is a schematic side view showing the back grinding step shown in FIG. 2.

In the wafer processing method according to the preferred embodiment, the back grinding step is first performed in such a manner that the back side 11b of the wafer 11 is ground, so as to reduce the thickness of the wafer 11 to a predetermined thickness. FIG. 2 is a schematic perspective view showing the back grinding step, and FIG. 3 is a schematic side view showing the back grinding step. The back grinding step is performed by using a grinding apparatus 2 shown in FIGS. 2 and 3.

The grinding apparatus 2 includes a chuck table 4 for holding the wafer 11 under suction. The chuck table 4 is connected to a rotational drive source (not shown) such as a motor. The chuck table 4 has a rotation axis extending substantially parallel to a vertical direction. That is, the chuck table 4 is rotatable about its vertical axis by the rotational drive source. Further, a table moving mechanism (not shown) is provided below the chuck table 4, whereby the chuck table 4 is horizontally movable by the table moving mechanism. A part of the upper surface of the chuck table 4 is formed as a holding surface 4a for holding the second side 21b of the protective member 21 attached to the wafer 11 under suction. The holding surface 4a is connected through a suction passage (not shown) to a vacuum source (not shown), wherein the suction passage is formed inside the chuck table 4. A vacuum is applied from the vacuum source through the suction passage to the holding surface 4a, thereby producing a suction force for holding the protective member 21 attached to the wafer 11 under suction.

A grinding unit 6 is located above the chuck table 4. The grinding unit 6 includes a spindle housing (not shown) supported to a grinding unit elevating mechanism (not shown). A spindle 8 is rotatably supported in the spindle housing so as to project downward from the spindle housing. A disk-shaped mount 10 is fixed to the lower end of the spindle 8. A grinding wheel 12 having substantially the same diameter as that of the mount 10 is mounted on the lower surface of the mount 10. The grinding wheel 12 includes a wheel base 14 formed of metal such as aluminum or stainless steel. A plurality of abrasive members 16 are fixed to the lower surface of the wheel base 14 so as to be annularly arranged along the outer circumference of the wheel base 14. A rotational drive source (not shown) such as a motor is connected to the upper end side (base end side) of the spindle 8, so as to rotate the spindle 8 about its axis extending substantially parallel to a vertical direction. Accordingly, the grinding wheel 12 is rotatable about its axis aligned with the axis of the spindle 8 by a torque transmitted from the rotational drive source.

In the back grinding step, the second side 21b of the protective member 21 attached to the wafer 11 is first brought into contact with the holding surface 4a of the chuck table 4. Thereafter, a vacuum is applied from the vacuum source to the holding surface 4a of the chuck table 4. Accordingly, the wafer 11 is held through the protective member 21 on the chuck table 4 under suction in the condition where the back side 11b of the wafer 11 is exposed upward. Thereafter, the chuck table 4 holding the wafer 11 is moved to a position below the grinding wheel 12 as shown in FIGS. 2 and 3. In this condition, both the chuck table 4 and the grinding wheel 12 are rotated and the spindle housing (the spindle 8) is then lowered as supplying a grinding fluid such as pure water to a work point. The amount of lowering of the spindle housing is adjusted to such an extent that the lower surface of each abrasive member 16 is pressed on the back side 11b of the wafer 11. Accordingly, the back side 11b of the wafer 11 can be ground by the abrasive members 16. This grinding is performed as measuring the thickness of the wafer 11. When the thickness of the wafer 11 is reduced to a predetermined thickness (typically, a finished thickness of each device chip) by this grinding, the back grinding step is finished.

Figure 4:
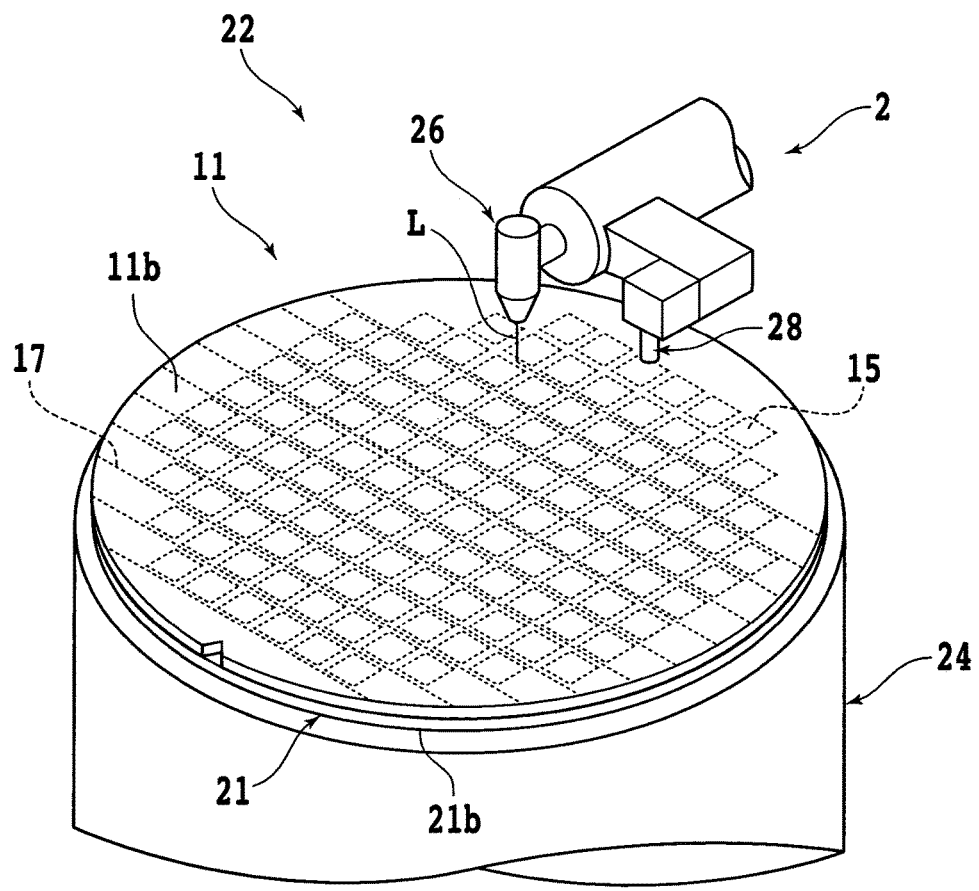
FIG. 4 is a schematic perspective view showing a modified layer forming step according to the preferred embodiment.
Figure 5:
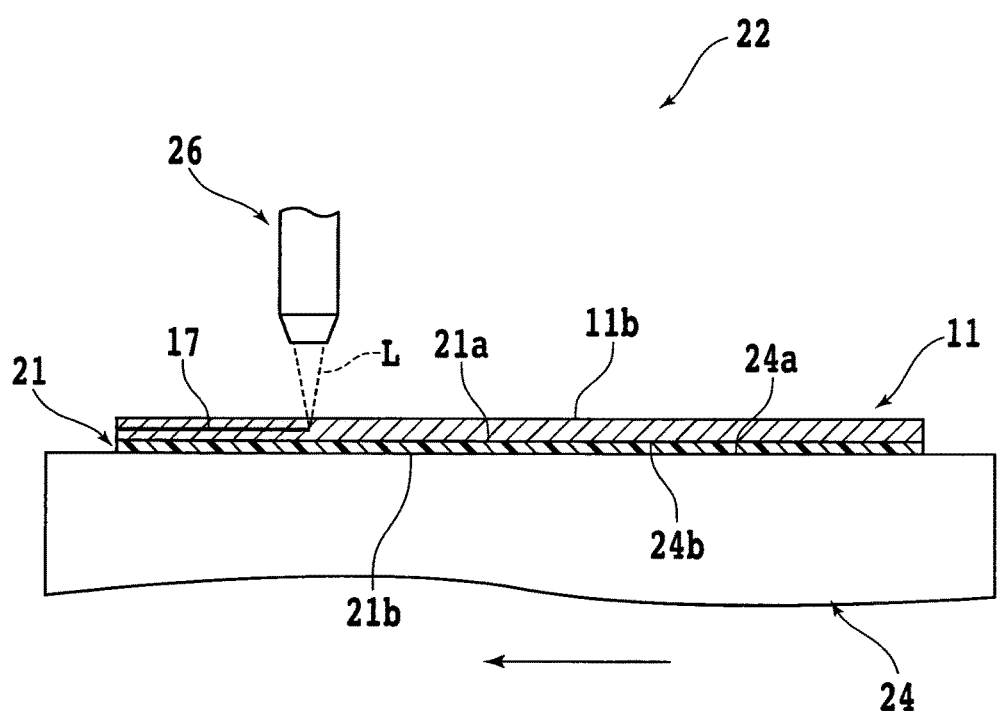
FIG. 5 is a partially sectional side view schematically showing the modified layer forming step shown in FIG. 4.

After performing the back grinding step, the modified layer forming step is performed in such a manner that a laser beam having a transmission wavelength to the wafer 11 is applied to the wafer 11 along each division line 13 so as to be focused inside the wafer 11, thereby forming a modified layer inside the wafer 11 along each division line 13. FIG. 4 is a schematic perspective view showing the modified layer forming step, and FIG. 5 is a partially sectional side view schematically showing the modified layer forming step. The modified layer forming step is performed by using a laser processing apparatus 22 shown in FIGS. 4 and 5.

The laser processing apparatus 22 includes a chuck table 24 for holding the wafer 11 under suction. The chuck table 24 is connected to a rotational drive source (not shown) such as a motor. The chuck table 24 has a rotation axis extending substantially parallel to a vertical direction. That is, the chuck table 24 is rotatable about its vertical axis by the rotational drive source. Further, a table moving mechanism (not shown) is provided below the chuck table 24, whereby the chuck table 24 is horizontally movable by the table moving mechanism. A part of the upper surface of the chuck table 24 is formed as a holding surface 24a for holding the second side 21b of the protective member 21 attached to the wafer 11 under suction. The holding surface 24a is connected through a suction passage (not shown) to a vacuum source (not shown), wherein the suction passage is formed inside the chuck table 24. A vacuum is applied from the vacuum source through the suction passage to the holding surface 24a, thereby producing a suction force for holding the protective member 21 attached to the wafer 11 under suction. A laser processing unit 26 is located above the chuck table 24. A camera (imaging unit) 28 for imaging the wafer 11 is located adjacent to the laser processing unit 26. The laser processing unit 26 functions to apply a pulsed laser beam L oscillated from a laser oscillator (not shown) to a predetermined position on the wafer 11 so as to be focused inside the wafer 11. The pulsed laser beam L to be oscillated from the laser oscillator has a wavelength hard to absorb in the wafer 11 (i.e., a transmission wavelength to the wafer 11).

In the modified layer forming step, the second side 21b of the protective member 21 attached to the wafer 11 is first brought into contact with the holding surface 24a of the chuck table 24. Thereafter, a vacuum is applied from the vacuum source to the holding surface 24a of the chuck table 24. Accordingly, the wafer 11 is held through the protective member 21 on the chuck table 24 under suction in the condition where the back side 1ib of the wafer 11 is exposed upward. Thereafter, the chuck table 24 holding the wafer 11 is moved and rotated to position one end of a predetermined one of the division lines 13 directly below the laser processing unit 26. Thereafter, the laser beam L is applied from the laser processing unit 26 to the back side 11b of the wafer 11, and at the same time the chuck table 24 is moved in a direction parallel to the predetermined division line 13. That is, the laser beam L is applied to the back side 11b of the wafer 11 along the predetermined division line 13. At this time, the focal point of the laser beam L is previously set inside the wafer 11. Accordingly, the wafer 11 is modified in the vicinity of the focal point of the laser beam L by multiphoton absorption, so that a modified layer (modified region) 17 can be formed inside the wafer 11 along the predetermined division line 13. Thereafter, the movement and rotation of the chuck table 24 and the application and focusing of the laser beam L along all of the other division lines 13 are repeated to thereby form a plurality of similar modified layers 17 inside the wafer 11 along all of the other division lines 13. Thus, the modified layer forming step is finished.

Figure 6A:
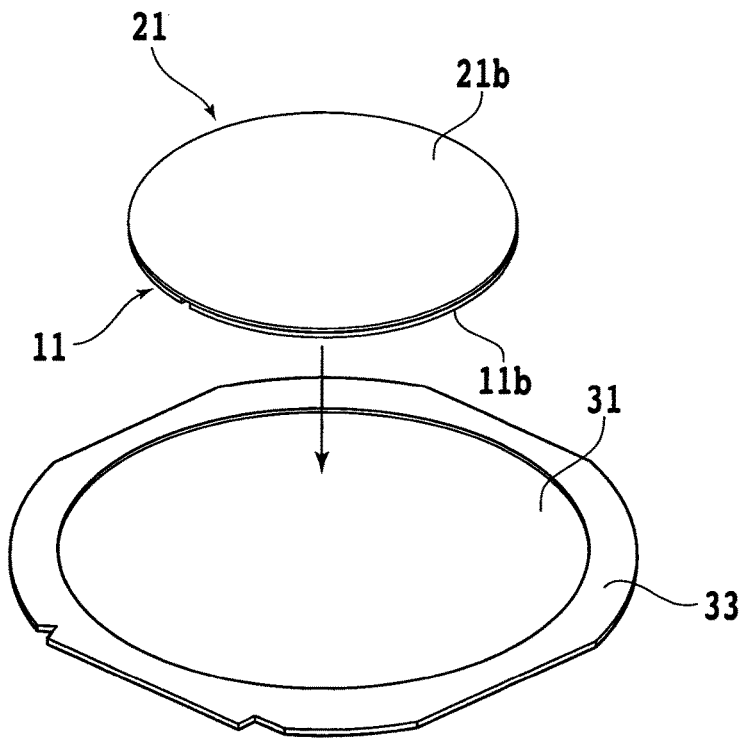
FIGS. 6A and 6B are schematic perspective views showing a wafer supporting step according to the preferred embodiment.
Figure 6B:
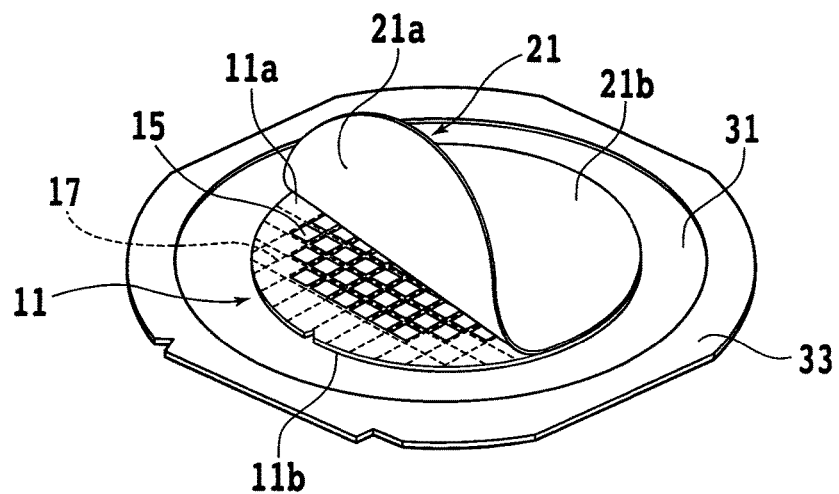

After performing the modified layer forming step, the wafer supporting step is performed in such a manner that an expandable dicing tape is attached to the back side 11b of the wafer 11 and the peripheral portion of the dicing tape is fixed to an annular frame. FIGS. 6A and 6B are schematic perspective views showing the wafer supporting step.

In the wafer supporting step, an expandable dicing tape 31 is attached to the back side 11b of the wafer 11 removed from the chuck table 24 as shown in FIG. 6A. The dicing tape 31 is circular in shape and it has a diameter larger than that of the wafer 11. Further, an annular frame 33 is fixed to the peripheral portion of the dicing tape 31 as shown in FIG. 6A. In other words, the peripheral portion of the dicing tape 31 is mounted to the annular frame 33. The timing of fixing the annular frame 33 to the dicing tape 31 is not especially limited. For example, after the annular frame 33 is fixed to the peripheral portion of the dicing tape 31, the dicing tape 31 may be attached to the wafer 11. Alternatively, after the dicing tape 31 is attached to the wafer 11, the annular frame 33 may be fixed to the peripheral portion of the dicing tape 31. Thus, the wafer 11 is supported through the dicing tape 31 to the annular frame 33. Thereafter, as shown in FIG. 6B, the protective member 21 is peeled from the front side 11a of the wafer 11. Thus, the wafer supporting step is finished.

Figure 7A:
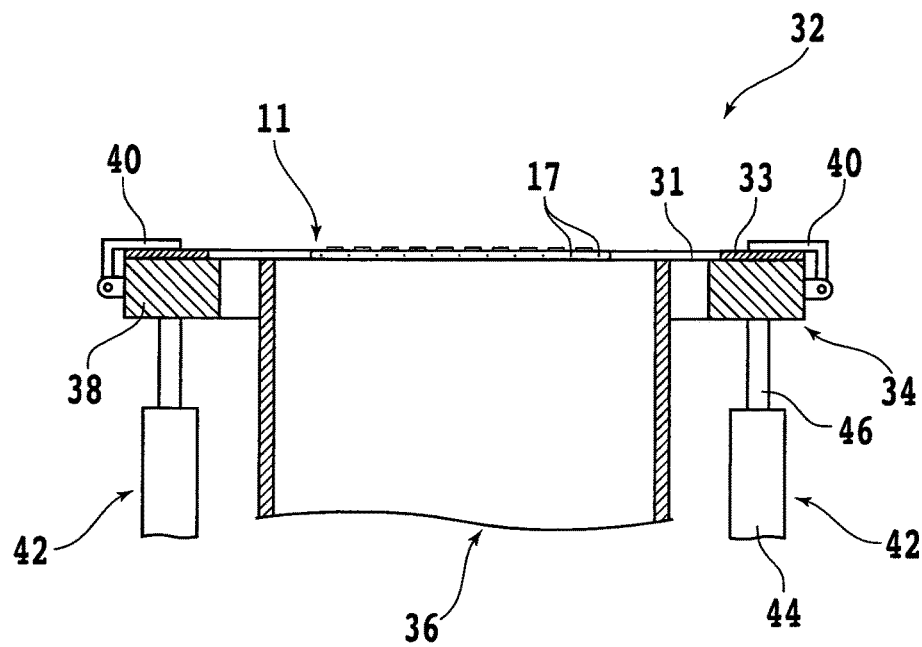
FIGS. 7A and 7B are partially sectional side views schematically showing a tape expanding step according to the preferred embodiment.
Figure 7B:
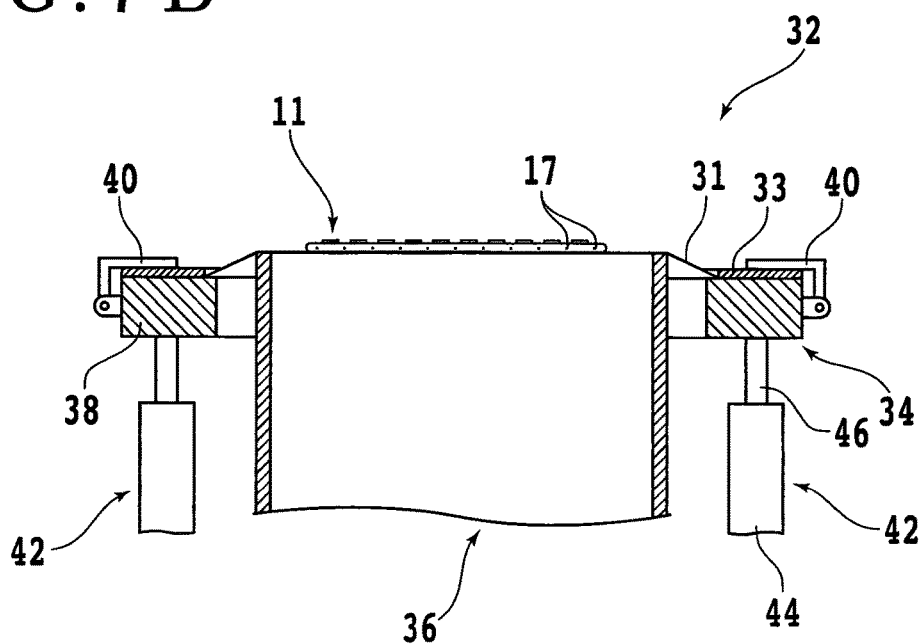
Figure 8A:
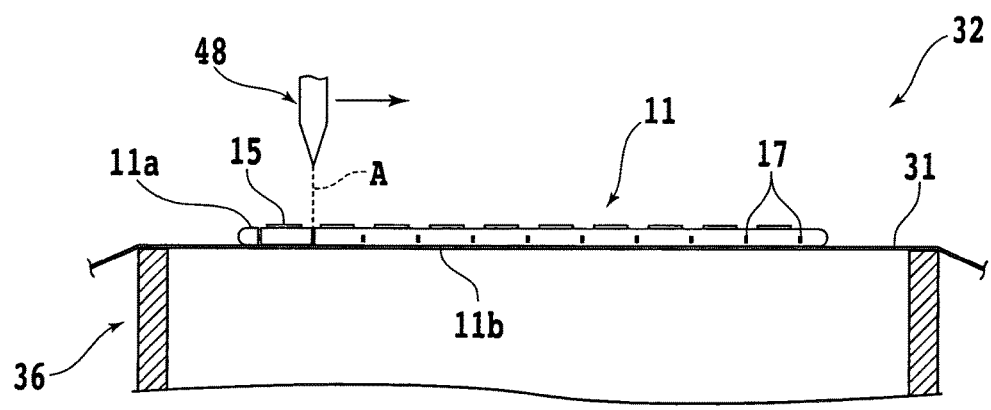
FIGS. 8A and 8B are partially sectional side views schematically showing an air blowing step according to the preferred embodiment.
Figure 8B:
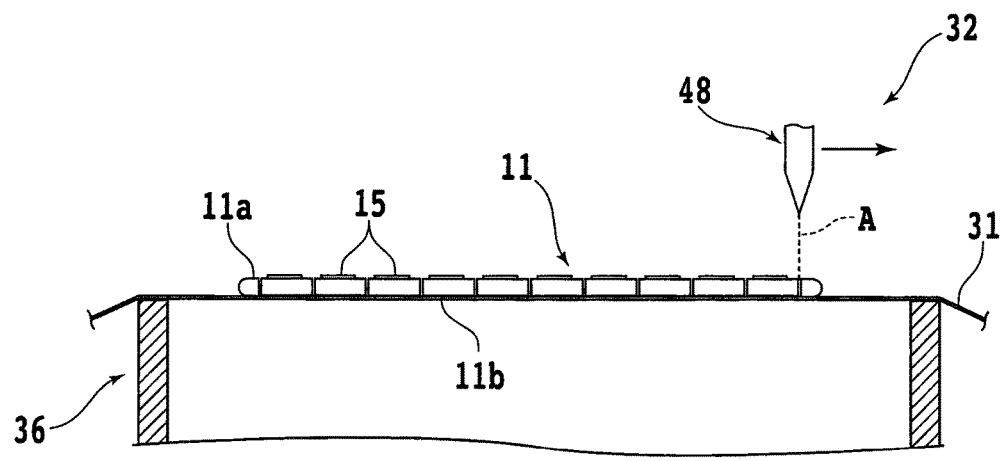

After performing the wafer supporting step, the tape expanding step is performed in such a manner that the dicing tape 31 attached to the wafer 11 is expanded and the air blowing step is also performed in such a manner that air is blown against the wafer 11 in the condition where the dicing tape 31 is expanded. FIGS. 7A and 7B are partially sectional side views schematically showing the tape expanding step, and FIGS. 8A and 8B are partially sectional side views schematically showing the air blowing step. The tape expanding step and the air blowing step are performed by using an expanding and dividing apparatus 32 shown in FIGS. 7A, 7B, 8A, and 8B.

The expanding and dividing apparatus 32 includes a support structure 34 for supporting the wafer 11 supported through the dicing tape 31 to the annular frame 33 and a cylindrical expansion drum 36 for expanding the dicing tape 31. The inner diameter of the expansion drum 36 is larger than the diameter of the wafer 11, and the outer diameter of the expansion drum 36 is smaller than the inner diameter of the annular frame 33. The support structure 34 includes a frame supporting table 38 for supporting the annular frame 33. The upper surface of the frame supporting table 38 functions as a support surface for supporting the annular frame 33 thereon. A plurality of clamps 40 for fixing the annular frame 33 are provided on the outer circumference of the frame supporting table 38. A plurality of elevating mechanisms 42 are provided below the support structure 34, so as to vertically move the support structure 34. Each elevating mechanism 42 includes a cylinder case 44 fixed at its lower end to a base (not shown) and a piston rod 46 operatively inserted in the cylinder case 44. The upper end of the piston rod 46 is fixed to the lower surface of the frame supporting table 38. All of the elevating mechanisms 42 are operated in synchronism with each other to vertically move the support structure 34 between a reference position where the upper surface (support surface) of the frame supporting table 38 is at substantially the same level as that of the upper end of the expansion drum 36 and an expansion position where the upper surface (support surface) of the frame supporting table 38 is at a level lower than that of the upper end of the expansion drum 36. Although not shown, the lower end of the expansion drum 36 is fixed to the base mentioned above.

As shown in FIG. 8A, an air knife (air nozzle) 48 for blowing air A downwardly is provided above the support structure 34 and the expansion drum 36. The air knife 48 extends in a direction parallel to the upper surface of the frame supporting table 38, i.e., in a direction perpendicular to the sheet plane of FIG. 8A. The length of the air knife 48 in this direction of extension is larger than the diameter of the wafer 11. The air knife 48 is connected to a moving mechanism (not shown), whereby the air knife 48 is movable in a direction perpendicular to the extension direction of the air knife 48 in a plane parallel to the upper surface of the frame supporting table 38. Alternatively, the support structure 34 and the expansion drum 36 may be movable relative to the air knife 48 in the condition where the air knife 48 is fixed in position.

In the tape expanding step, the annular frame 33 supporting the wafer 11 through the dicing tape 31 is first placed on the upper surface of the frame supporting table 38 set in the reference position and then fixed by the clamps 40 as shown in FIG. 7A. In this condition, the upper end of the expansion drum 36 is in contact with the dicing tape 31 in its annular area between the wafer 11 and the annular frame 33. Thereafter, the elevating mechanisms 42 are synchronously operated to lower the support structure 34 to the expansion position where the upper surface of the frame supporting table 38 is lower in level than the upper end of the expansion drum 36 as shown in FIG. 7B. As a result, the expansion drum 36 is raised relative to the frame supporting table 38, so that the dicing tape 31 is pushed upward and expanded by the expansion drum 36.

Simultaneously with the tape expanding step or after performing the tape expanding step, the air blowing step of blowing the air A against the wafer 11 is performed. In the air blowing step, the extension direction of the air knife 48 is first made parallel to a first direction where some of the crossing division lines 13 formed on the wafer 11 extends. In this condition, the air A can be blown from the air knife 48 against the division lines 13 extending in the first direction. This setting of making the extension direction of the air knife 48 parallel to the first direction may be performed at the time the annular frame 33 is fixed in the tape expanding step. Thereafter, the air A is blown downward from the air knife 48, and at the same time the air knife 48 is moved relative to the support structure 34 and the expansion drum 36 in a direction perpendicular to the extension direction of the air knife 48 in a plane parallel to the upper surface of the frame supporting table 38 (i.e., in a second direction perpendicular to the first direction on the wafer 11). That is, the second direction is the direction where the other division lines 13 extend. As shown in FIG. 8A, when the air knife 48 reaches a position directly above a predetermined one of the division lines 13 extending in the first direction, the air A blown downward from the air knife 48 functions to apply a downward force to the predetermined division line 13 and its near region.

The wafer 11 has already received a force having a direction of expanding the dicing tape 31 (i.e., a force acting in the radial direction of the wafer 11 in the preferred embodiment). Accordingly, owing to a synergistic effect of the force produced by the expansion of the dicing tape 31 and the force produced by the blowing of the air A, the wafer 11 can be properly broken along the predetermined division line 13 where the modified layer 17 is formed. In the preferred embodiment, the air knife 48 is moved in the second direction relative to the support structure 34 and the expansion drum 36 as blowing the air A from the air knife 48. Accordingly, the wafer 11 can be broken along all of the division lines 13 extending in the first direction as shown in FIG. 8B.

After breaking the wafer 11 along all of the division lines 13 extending in the first direction as mentioned above, the wafer 11 is rotated 90 degrees to make the second direction parallel to the extension direction of the air knife 48. In this condition, the air A is blown downward from the air knife 48, and at the same time the air knife 48 is moved relative to the support structure 34 and the expansion drum 36 in a direction perpendicular to the extension direction of the air knife 48 in a plane parallel to the upper surface of the frame supporting table 38 (i.e., in the first direction on the wafer 11). Accordingly, the wafer 11 can be broken along all of the division lines 13 extending in the second direction. As a result, the wafer 11 is broken along all of the crossing division lines 13 extending in the first and second directions on the wafer 11, thereby obtaining a plurality of device chips divided from the wafer 11. Thus, the air blowing step is finished. Further, the air blowing step is performed in the condition where the dicing tape 31 is expanded as mentioned above. Accordingly, when the wafer 11 is divided into the device chips, the spacing between any adjacent ones of the device chips can be increased. As a result, it is possible to suppress the possibility that the adjacent device chips may come into contact with each other in a subsequent step to cause damage to each device chip.

In the wafer processing method according to the preferred embodiment, the air A is blown against the wafer 11 in the condition where the dicing tape 31 attached to the back side 11b of the wafer 11 is expanded. Accordingly, a force produced by the expansion of the dicing tape 31 and a force produced by the blowing of the air A can be used in combination to thereby properly divide the wafer 11. Further, in the wafer processing method according to the preferred embodiment, the air A is simply blown against the wafer 11 in the condition where the dicing tape 31 is expanded. That it is unnecessary to press a blade or the like against all of the division lines 13. Accordingly, the productivity of the device chips can also be improved in the preferred embodiment. Thus, it is possible to provide a wafer processing method which can properly divide the wafer 11 and can also improve the productivity of the device chips.

Further, in the wafer processing method according to the preferred embodiment, it is unnecessary to press a blade or the like against each division line 13. Accordingly, it is possible to suppress the possibility that the device chips may be damaged in dividing the wafer 11. Further, in the wafer processing method according to the preferred embodiment, the air A is blown against the wafer 11 in the condition where the dicing tape 31 is expanded. Accordingly, when the wafer 11 is divided into the device chips, the spacing between any adjacent ones of the device chips can be increased. As a result, it is possible to suppress the possibility that the adjacent device chips may come into contact with each other in a subsequent step to cause damage to each device chip.

The present invention is not limited to the above preferred embodiment, but various modifications may be made. For example, while the back grinding step of grinding the back side 11b of the wafer 11 is performed in the preferred embodiment, this back grinding step may be omitted in the present invention.

Further, while the wafer supporting step is performed after performing the modified layer forming step in the preferred embodiment, the wafer supporting step may be performed before performing the modified layer forming step. In this case, the laser beam L may be applied to the front side 11a of the wafer 11 in the condition where the dicing tape 31 is attached to the back side 11b of the wafer 11. Alternatively, the laser beam L may be applied to the back side 11b of the wafer 11 in the condition where the dicing tape 31 is attached to the front side 11a of the wafer 11.

Further, while the air knife 48 is used to blow the air A against the wafer 11 in the preferred embodiment, any means for blowing air may be used in the present invention. For example, a general nozzle capable of blowing air may be used.

Further, in the above preferred embodiment, the air A is continuously blown against the wafer 11 while the air knife 48 is being moved relative to the support structure 34 and the expansion drum 36. However, as a modification, the position of each division line 13 may be confirmed by the camera (imaging unit) 28 and the air A may be intermittently blown against the wafer 11 according to the position of each division line 13.

Further, in the above preferred embodiment, the air A is blown directly against the wafer 11 from the air knife 48. However, as a modification, a protective sheet for protecting the front side 11a of the wafer 11 may be attached to the front side 11a before blowing air, and air may be blown against the front side 11a of the wafer 11 through this protective sheet. Alternatively, air may be blown against the back side 11b of the wafer 11 through the dicing tape 31 attached to the back side 11b. In this case, it is possible to suppress the possibility that foreign matter such as dust present in the air may adhere to the wafer 11.

Figure 9A:
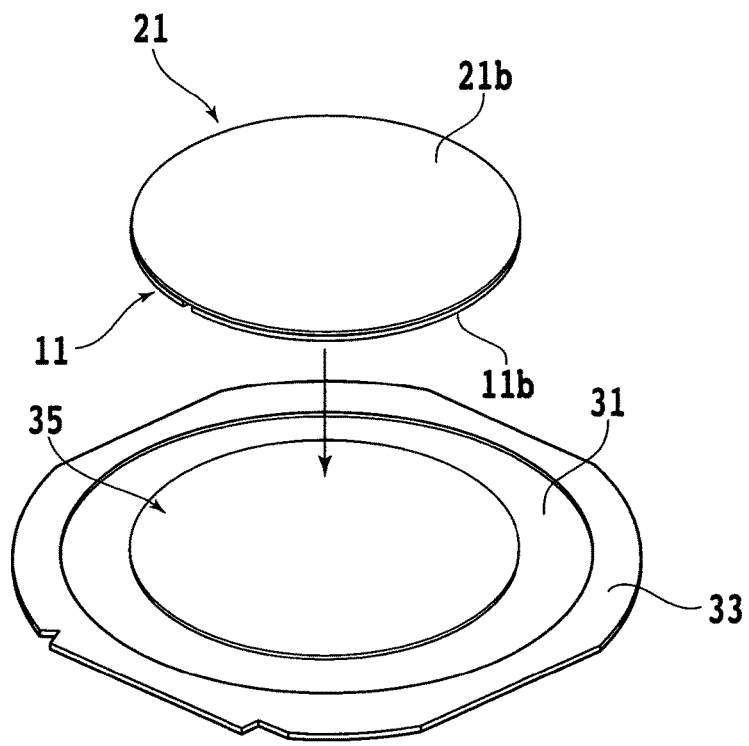
FIGS. 9A and 9B are schematic perspective views showing a wafer supporting step according to a modification of the preferred embodiment.
Figure 9B:
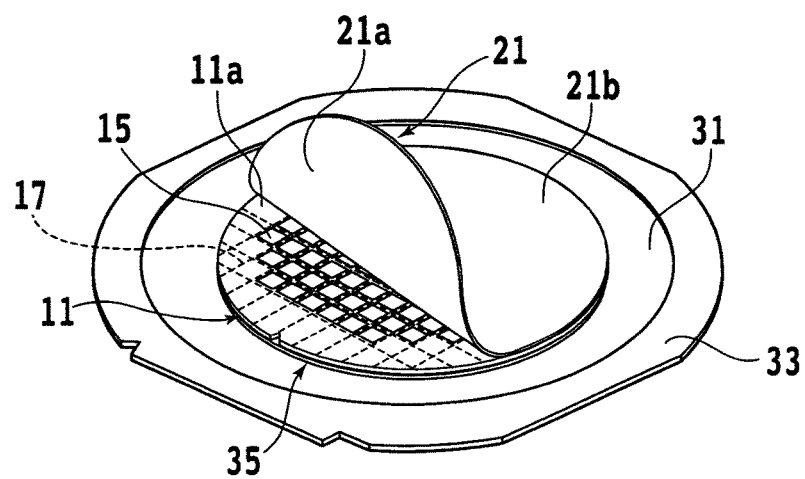
Figure 10A:
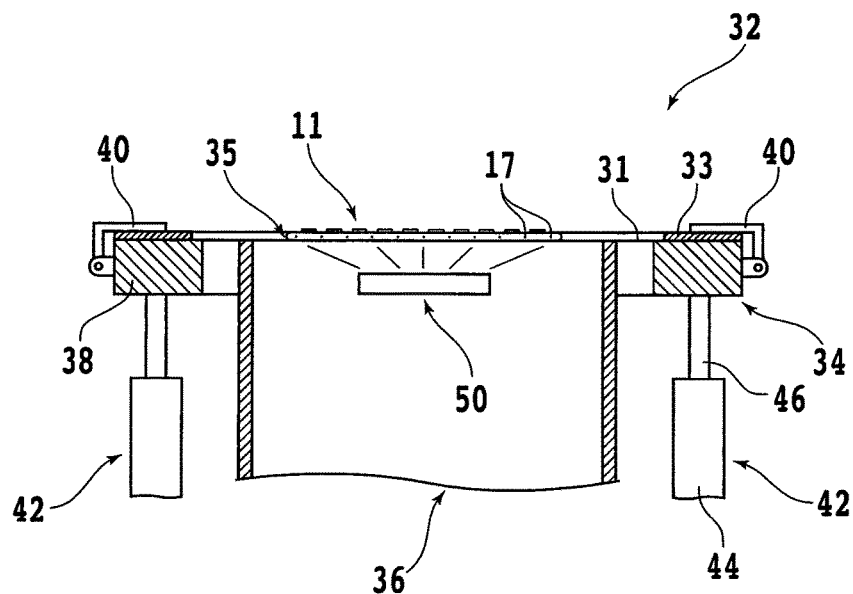
FIGS. 10A and 10B are partially sectional side views schematically showing a tape expanding step according to the modification.
Figure 10B:
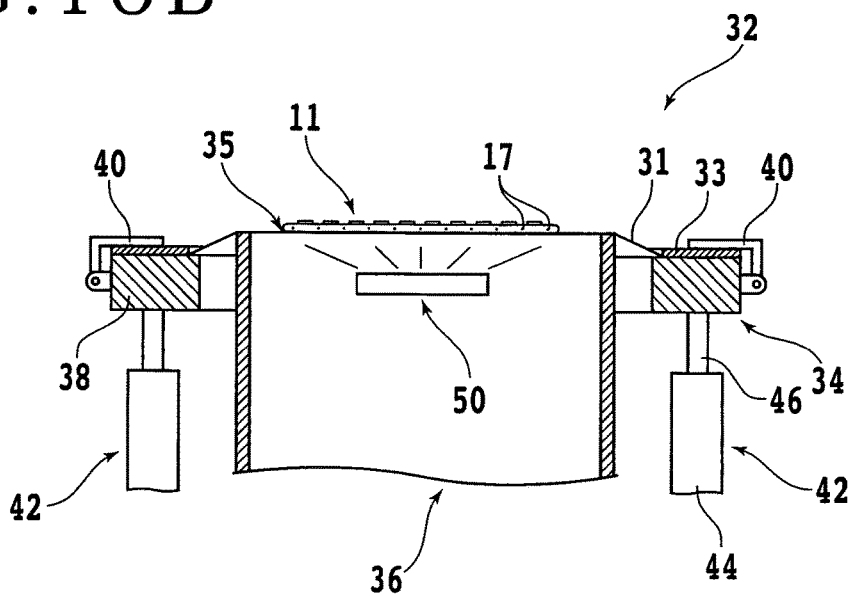
Figure 11A:
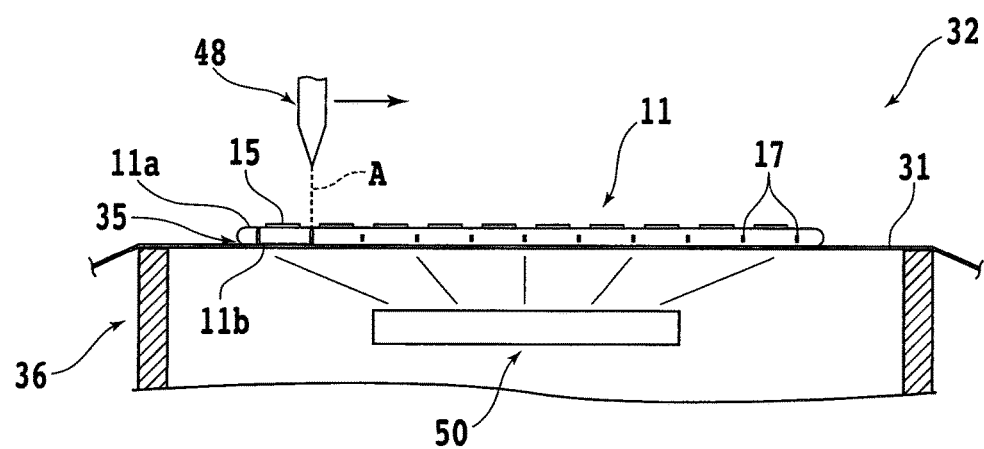
FIGS. 11A and 11B are partially sectional side views schematically showing an air blowing step according to the modification.
Figure 11B:
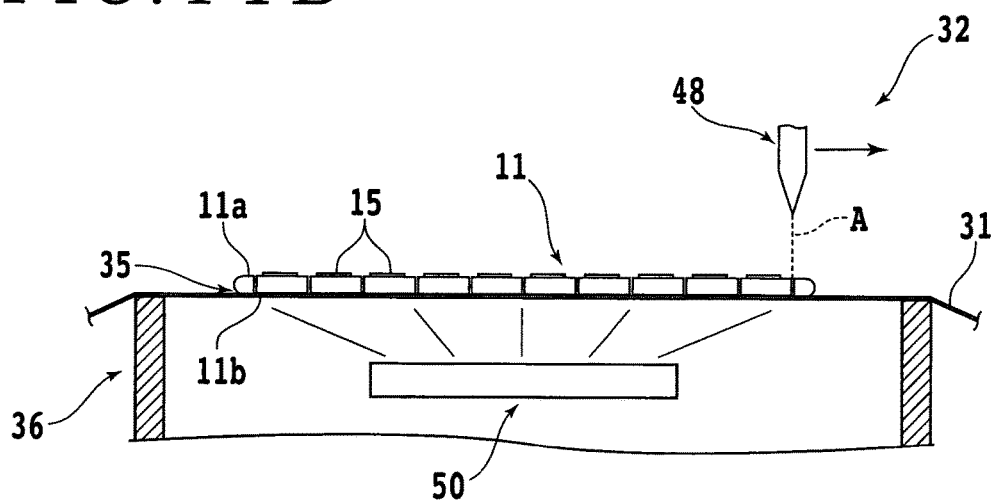

Further, a die bonding film such as die attach film (DAF) may be attached to the wafer 11 before dividing the wafer 11 as a modification. FIGS. 9A and 9B are schematic perspective views showing a wafer supporting step according to such a modification, FIGS. 10A and 10B are partially sectional side views schematically showing a tape expanding step according to the modification, and FIGS. 11A and 11B are partially sectional side views schematically showing an air blowing step according to the modification. In the following description of the modification, substantially the same parts as those in the above preferred embodiment are denoted by the same reference symbols and the detailed description thereof will be omitted.

As shown in FIG. 9A, the dicing tape 31 is attached through a die bonding film 35 to the back side 11b of the wafer 11 in the wafer supporting step. Further, the annular frame 33 is fixed to the peripheral portion of the dicing tape 31. Thus, the wafer 11 is supported through the die bonding film 35 and the dicing tape 31 to the annular frame 33. After supporting the wafer 11 to the annular frame 33 as mentioned above, the protective member 21 is peeled and removed from the front side 11a of the wafer 11 as shown in FIG. 9B.

In the tape expanding step, the annular frame 33 is first placed on the upper surface of the frame supporting table 38 and then fixed by the clamps 40 as shown in FIG. 10A. Further, cold air is supplied from a cooling unit 50 to the die bonding film 35, thereby cooling the die bonding film 35 to reduce its expandability. The cooling unit 50 is located below the wafer 11. Thereafter, the elevating mechanisms 42 are operated to lower the support structure 34 to the expansion position where the upper surface of the frame supporting table 38 is lower in level than the upper end of the expansion drum 36 as shown in FIG. 10B. As a result, the expansion drum 36 is raised relative to the frame supporting table 38, so that the dicing tape 31 is pushed upward and expanded by the expansion drum 36. All over the period in the tape expanding step, the die bonding film 35 continues to be cooled by the cold air supplied from the cooling unit 50.

In the air blowing step, the air A is blown against the division lines 13 from the air knife 48 in the condition where the die bonding film 35 is cooled as shown in FIGS. 11A and 11B. Owing to a synergistic effect of the force produced by the expansion of the dicing tape 31 and the force produced by the blowing of the air A, the wafer 11 can be properly broken along each division line 13. Further, since the expandability of the die bonding film 35 is reduced by the cold air, the die bonding film 35 can also be properly broken along each division line 13 at the time the wafer 11 is broken. Thus, the wafer processing method according to the present invention is useful also in the case of dividing the wafer 11 after attaching the die bonding film 35 to the wafer 11.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual device chips along a plurality of crossing division lines, said division lines being formed on a front side of said wafer to thereby define a plurality of separate regions where a plurality of devices are individually formed, said device chips individually corresponding to said devices, said wafer processing method comprising:

a modified layer forming step of applying a laser beam having a transmission wavelength to said wafer along each division line so as to focus said laser beam inside said wafer, thereby forming a modified layer inside said wafer along each division line;

a wafer supporting step of attaching an expandable dicing tape to a back side of said wafer and mounting a peripheral portion of said dicing tape to an annular frame before or after performing said modified layer forming step;

a tape expanding step of expanding said dicing tape attached to the back side of said wafer; and an air blowing step of blowing air against said wafer along each division line to apply a downward force to each division line in the condition where said dicing tape is expanded, thereby dividing said wafer into said individual device chips along each division line where said modified layer is formed and also increasing spacing between any adjacent ones of said device chips.

2. The wafer processing method according to claim 1, wherein said air blowing step is performed by using an air knife for blowing said air.

3. The wafer processing method according to claim 1, further comprising:
   a back grinding step of grinding the back side of said wafer in the condition where a protective member is attached to the front side of said wafer, before performing said modified layer forming step, thereby reducing a thickness of said wafer to a predetermined thickness.

4. The wafer processing method according to claim 1, wherein said air blowing step is started simultaneously with said tape expanding step.

* * * * *